United States Patent
Lai et al.

(10) Patent No.: US 11,359,093 B2
(45) Date of Patent: Jun. 14, 2022

(54) POLYIMIDE FILM AND FLEXIBLE DISPLAY DEVICE COVER SUBSTRATE USING THE SAME

(71) Applicant: Microcosm Technology Co., Ltd., Tainan (TW)

(72) Inventors: Bo-Hung Lai, Tainan (TW); Chih-Te Yen, Tainan (TW); Tang-Chieh Huang, Tainan (TW)

(73) Assignee: Microcosm Technology Co., Ltd., Tainan (TW)

( * ) Notice: Subject to any disclaimer, the term of this patent is extended or adjusted under 35 U.S.C. 154(b) by 256 days.

(21) Appl. No.: 16/619,093

(22) PCT Filed: Apr. 1, 2019

(86) PCT No.: PCT/CN2019/080843
§ 371 (c)(1),
(2) Date: Dec. 4, 2019

(87) PCT Pub. No.: WO2020/199085
PCT Pub. Date: Oct. 8, 2020

(65) Prior Publication Data
US 2021/0171769 A1    Jun. 10, 2021

(51) Int. Cl.
*C08L 79/08*    (2006.01)
*C08K 3/22*    (2006.01)
*C08K 5/00*    (2006.01)

(52) U.S. Cl.
CPC ............... *C08L 79/08* (2013.01); *C08K 3/22* (2013.01); *C08K 5/0041* (2013.01); *C08K 2003/2231* (2013.01); *C08K 2003/2258* (2013.01); *C08K 2201/005* (2013.01); *C08L 2201/08* (2013.01); *C08L 2201/10* (2013.01); *C08L 2203/16* (2013.01); *C08L 2203/206* (2013.01)

(58) Field of Classification Search
None
See application file for complete search history.

(56) References Cited

U.S. PATENT DOCUMENTS

| | | | |
|---|---|---|---|
| 8,163,359 B2 | 4/2012 | Ko et al. | |
| 2009/0130451 A1* | 5/2009 | Farrell | C08K 3/30 |
| | | | 428/411.1 |
| 2019/0002708 A1* | 1/2019 | Tsunematsu | C09D 7/61 |
| 2019/0077676 A1* | 3/2019 | Nakayama | C01G 41/00 |

FOREIGN PATENT DOCUMENTS

| | | | |
|---|---|---|---|
| CN | 106095156 | | 11/2016 |
| CN | 107207943 | | 9/2017 |
| CN | 108779381 | | 11/2018 |
| CN | 208200811 | | 12/2018 |
| CN | 109312208 | | 2/2019 |
| JP | 2008 197158 | * | 8/2008 |
| TW | 201502180 | | 1/2015 |
| TW | 201805346 | | 2/2018 |
| TW | I635359 | | 9/2018 |
| WO | WO 02/090452 | * | 11/2002 |
| WO | 2013138258 | | 9/2013 |

OTHER PUBLICATIONS

Machine Translation of CN208200811 (Year: 2018).*
Machine translation of Akitoshi et al. JP 2008 197158 (Year: 2008).*
"International Search Report (Form PCT/ISA/210) of PCT/CN2019/080843," dated Jan. 6, 2020, pp. 1-4.
"Written Opinion of the International Searching Authority (Form PCT/ISA/237) of PCT/CN2019/080843," dated Jan. 6, 2020, pp. 1-4.
"Office Action of Taiwan Counterpart Application", dated Jul. 8, 2020, p. 1-p. 7.

* cited by examiner

*Primary Examiner* — Robert T Butcher
(74) *Attorney, Agent, or Firm* — JCIPRNET

(57) ABSTRACT

A polyimide film and a flexible display device cover substrate using the same are provided, and the polyimide film includes a polyimide and a blue infrared absorbing agent. The blue infrared absorbing agent includes cesium tungsten oxide, tungsten oxide, Prussian blue, or antimony tin oxide. The blue infrared absorbing agent has infrared absorbing and photothermal conversion effects, and the surface temperature of the polyimide resin may be increased by infrared irradiation, so as to shorten the baking time.

13 Claims, 1 Drawing Sheet

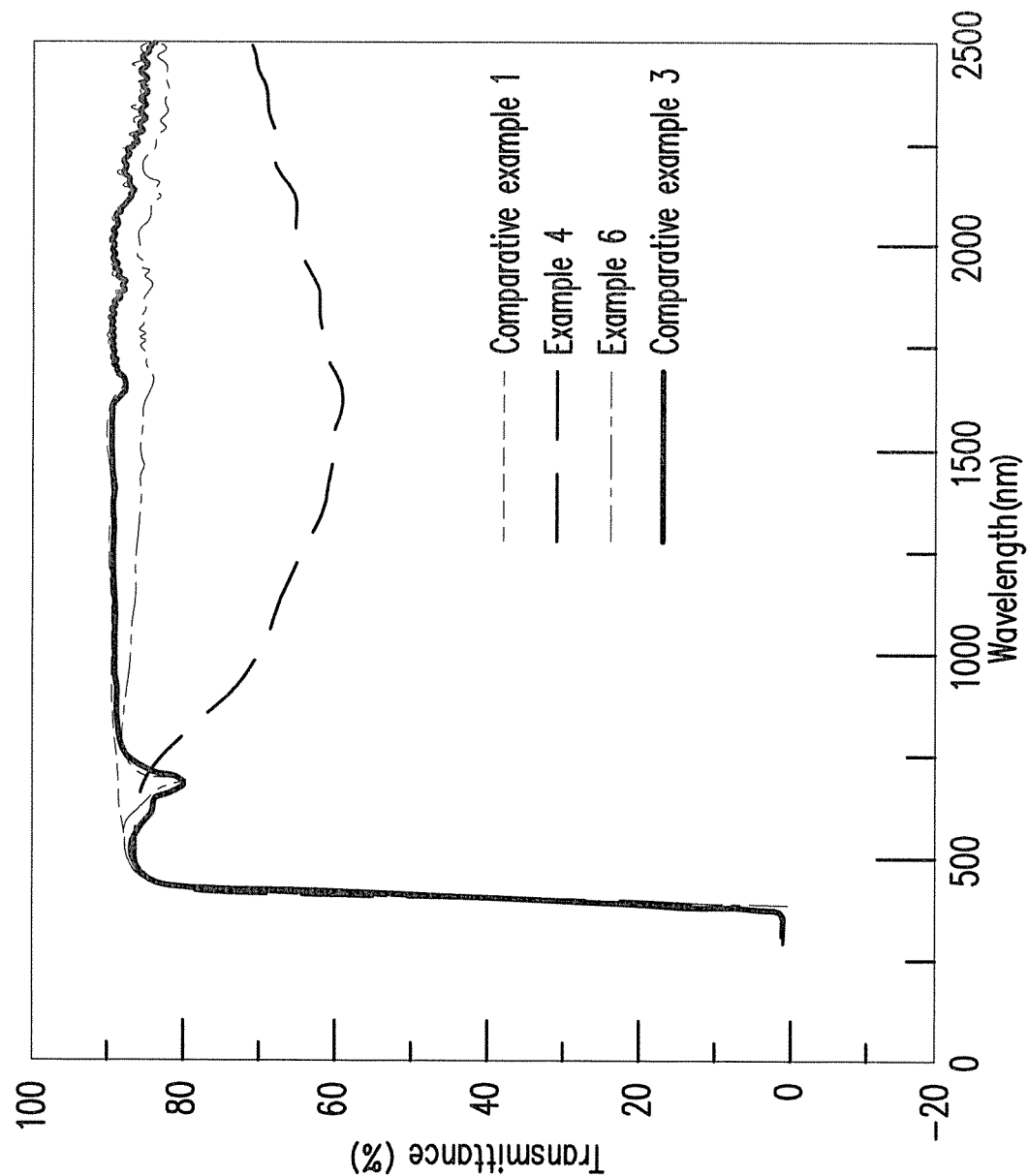

POLYIMIDE FILM AND FLEXIBLE DISPLAY DEVICE COVER SUBSTRATE USING THE SAME

CROSS-REFERENCE TO RELATED APPLICATION

This application is a 371 application of the international PCT application serial no. PCT/CN2019/080843, filed on Apr. 1, 2019. The entirety of each of the abovementioned patent application is hereby incorporated by reference herein and made a part of this specification.

BACKGROUND OF THE INVENTION

Field of the Invention

The invention relates to a polyimide film and a flexible display device cover substrate using the same, and in particular to a polyimide film containing a blue infrared absorbing agent and a flexible display device cover substrate using the same.

Description of Related Art

With the development of displays, thinning, light weight, and even flexibility are the development directions of current displays. Therefore, how to reduce the thickness and weight of glass substrates and even replace glass substrates with plastic substrates is an important consideration in the industry.

Polyimide polymer is a plastic material with thermal stability, high mechanical strength, and chemical resistance. However, due to the molecular structure, intramolecular and intermolecular charge transfer readily occur, thus causing the polyimide film to yellow, and thus limiting the application thereof. In order to reduce the phenomenon of charge transfer, a linkage group may be generally introduced to make the main chain flexible, or some larger groups may be introduced to destroy the stacking condition thereof to achieve the same effect. The above description is as follows: (—O—), (—CO—), (—CH2—), (—CF$_3$CCF$_3$—), etc., or an alicyclic structure is introduced into polyimide. Although these methods may make the polyimide transparent, when the thickness of the polyimide film is increased, the yellow index YI of the film is also increased, and a yellowing phenomenon occurs to the appearance visually.

Since polyimide needs to undergo an imidization step in the film forming process, high-temperature baking at 250° C. to 400° C. needs to be performed whether thermal imidization or chemical imidization is adopted, and to increase production efficiency and reduce baking time, currently the industry elects the use of infrared heating. However, introduction of a fluorine-containing functional group and an alicyclic structure for transparency does not allow polyimide to absorb in the infrared region, and therefore an infrared heating process cannot be used.

Based on the above, a polyimide film is developed, wherein the surface temperature of the polyimide resin may be increased by infrared irradiation to shorten baking time, which is an important topic for current research.

SUMMARY OF THE INVENTION

The invention provides a polyimide film and a flexible display device cover substrate using the same, and the polyimide film contains a blue infrared absorbing agent having infrared absorbing and photothermal conversion effects. Therefore, the surface temperature of the imide resin may be increased by infrared irradiation to shorten baking time.

A polyimide film of the invention includes a polyimide and a blue infrared absorbing agent. The blue infrared absorbing agent includes cesium tungsten oxide, tungsten oxide, Prussian blue, or antimony tin oxide.

In an embodiment of the invention, the polyimide film has an absorption peak at a wavelength of 800 nm to 4000 nm.

In an embodiment of the invention, a thickness of the polyimide film is 10 μm to 100 μm, a total light transmittance thereof is 85% or more, and a yellow index YI thereof is less than 2.

In an embodiment of the invention, an absorption wavelength of the blue infrared absorbing agent is 500 nm to 4000 nm, and a thermal conversion efficiency of the blue infrared absorbing agent is greater than 50%.

In an embodiment of the invention, a particle size of the blue infrared absorbing agent is less than 100 nm.

In an embodiment of the invention, based on a total weight of the polyimide film, an amount of the blue infrared absorbing agent is 0.05 wt % to 0.5 wt %.

In an embodiment of the invention, the polyimide film further includes a hue conditioning material, wherein the hue conditioning material includes a blue dye, a blue pigment, or a fluorescent dye or a fluorescent pigment having an absorption wavelength of 360 nm to 430 nm and an emission wavelength of 430 from nm to 530 nm.

In an embodiment of the invention, based on a total weight of the polyimide film, an amount of the blue dye or the blue pigment is 0.001 wt % to 0.01 wt %.

In an embodiment of the invention, based on a total weight of the polyimide film, an amount of the fluorescent dye or the fluorescent pigment is 0.001 wt % to 0.5 wt %.

In an embodiment of the invention, the blue infrared absorbing agent has a hue conditioning effect.

The invention also provides a flexible display device cover substrate including the polyimide film and a device protective layer. The device protective layer is formed by a hydrophobic hard coating layer and disposed on at least one side of the polyimide film.

In an embodiment of the invention, a total light transmittance of the flexible display device cover substrate is 85% or more and a thickness thereof is 50 μm to 200 μm.

In an embodiment of the invention, a thickness of the hydrophobic hard coating layer is 5 μm to 30 μm and a hardness thereof is 7H to 9H.

In an embodiment of the invention, the hydrophobic hard coating layer contains a blue infrared absorbing agent and a hue conditioning material, and the hue conditioning material includes a blue dye, a blue pigment, or a fluorescent dye or a fluorescent pigment having an absorption wavelength of 360 nm to 430 nm and an emission wavelength of 430 nm to 530 nm.

In an embodiment of the invention, based on a total weight of the hydrophobic hard coating layer, an amount of the blue infrared absorbing agent is 0.05 wt % to 0.5 wt %.

In an embodiment of the invention, based on a total weight of the hydrophobic hard coating layer, an amount of the blue dye or the blue pigment is 0.001 wt % to 0.01 wt %.

In an embodiment of the invention, based on a total weight of the hydrophobic hard coating layer, an amount of the fluorescent dye or the fluorescent pigment is 0.001 wt % to 0.5 wt %.

Based on the above, the polyimide film of the invention contains a blue infrared absorbing agent having infrared absorbing and photothermal conversion effects. Therefore, the surface temperature of the polyimide resin may be increased by infrared irradiation to shorten baking time, reduce energy loss, and increase production rate, and may simultaneously reduce the yellow index YI of polyimide and alleviate the visual yellowing phenomenon of the appearance.

In order to make the aforementioned features and advantages of the invention more comprehensible, embodiments are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1 is a schematic diagram showing the transmittance and wavelength of Example 4, Example 6, Comparative example 1, and Comparative example 3.

DESCRIPTION OF THE EMBODIMENTS

In the present specification, a range represented by "a numerical value to another numerical value" is a schematic representation for avoiding listing all of the numerical values in the range in the specification. Therefore, the recitation of a specific numerical range covers any numerical value in the numerical range and a smaller numerical range defined by any numerical value in the numerical range, as is the case with the any numerical value and the smaller numerical range stated explicitly in the specification.

The invention provides a polyimide film that may be used for a cover substrate of a flexible display device. In the following, embodiments are provided as examples of actual implementation of the invention. However, the embodiments are exemplary, and the invention is not limited thereto.

<Polyimide Film>

The invention provides a polyimide film including a polyimide and a blue infrared absorbing agent. The blue infrared absorbing agent has infrared absorbing and photothermal conversion effects, and also has a hue conditioning effect, and the thermal conversion efficiency thereof is greater than about 50%. The surface temperature of the polyimide resin may be increased by infrared irradiation, and the surface temperature of the polyimide film may reach 300° C. or higher after the infrared irradiation, thereby shortening baking time. The polyimide film of the invention has an absorption peak at a wavelength of about 800 nm to about 4000 nm, a thickness of, for example, 10 μm to 100 μm, a total light transmittance of, for example, 85% or more, and a yellow index YI of, for example, less than 2. Based on the total weight of the polyimide film, the amount of the infrared absorbing agent is, for example, 0.05 wt % to 0.5 wt %. Hereinafter, the various components above are described in detail.

<Blue Infrared Absorbing Agent>

The infrared absorbing agent of the invention is composed, for example, of inorganic nanoparticles, preferably, for example, an infrared absorbing agent with a blue powder and having a particle size of less than 100 nm, and may include cesium tungsten oxide, tungsten oxide, Prussian blue, or antimony tin oxide. The nanoparticles may be synthesized by a sol-gel method, a hydrothermal method, a solvothermal method, a microwave synthesis method, or the like, or may be sintered into a micron powder by powder metallurgy, and then subjected to dry or wet grinding to obtain nanoparticles. The blue infrared absorbing agent may also be used as a hue conditioning agent and a UV absorbing agent to reduce the yellow index of the transparent polyimide and reduce the yellowing caused by long-term UV irradiation, and has a hue conditioning effect.

<Polyimide>

The polyimide of the invention may be composed of a unit represented by the following chemical formula (1):

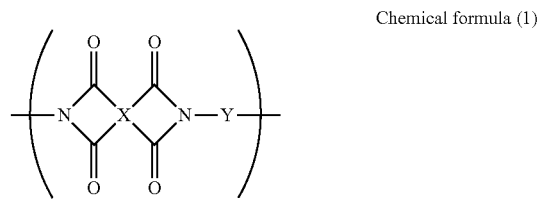

Chemical formula (1)

In the above chemical formula (1), X represents a dianhydride, which may include, but is not limited to: a mixture of two or more of 2,2'-bis-(3,4-dicarboxyphenyl)hexafluoropropane dianhydride (6FDA), 4,4'-diphenylether tetracarboxylic anhydride (ODPA), biphenyltetracarboxylic dianhydride (BPDA), benzophenone tetracarboxylic dianhydride (BTDA), cyclobutane tetracarboxylic dianhydride (CBDA), cyclopentane tetracarboxylic dianhydride (CPDA), 3,3',4,4'-diphenylsulfonetetracarboxylic anhydride (DSDA), 4,4'-(4,4'-isopropyldiphenoxy)bis(phthalic anhydride) (BPADA), 2,2-bis[4-(3,4-dicarboxyphenoxy)phenyl]hexafluoroisopropane dianhydride (HFBPADA), ethylene glycol bis(trimellitic anhydride) (TMEG), propylene glycol bis(trimellitic anhydride) (TMPG), bicyclo[2.2.1]heptane-2,3,5,6-tetracarboxylic dianhydride (BHDA), bicyclo[2.2.2]oct-7-ene-2,3,5,6-tetracarboxylic dianhydride (BOTDA), and bicyclo[2.2.2]octane-2,3,5,6-tetracarboxylic dianhydride (BODA), etc.

In the above chemical formula (1), Y represents a diamine which may include, but is not limited to: a mixture of two or more of bis[4-(4-aminophenoxy)phenyl]sulfone (BAPS), 2,2'-bis[4-(4-aminophenoxy)phenyl]propane (BAPP), 2,2-bis[4-(4-aminophenoxy)phenyl]-1,1,1,3,3,3-hexafluoropropane (APHF), 2,2'-bis(trifluoromethyl)benzidine (TFMB), 4,4'-diaminodiphenyl ether (ODA), diaminodiphenyl sulfone (3DDS, 4DDS), 2,2-bis(4-aminophenyl)hexafluoropropane (BISAF), cyclohexanediamine (CHDA), 1,3-bis(3-aminophenoxy)benzene (TPE-M), 1,3-bis(4-aminophenoxy)benzene (TPE-R), 1,4-bis(3-aminophenoxy)benzene, and 1,4-bis(4-aminophenoxy)benzene (TPE-Q), and the like.

The polymerization method may include dissolving a dianhydride monomer and a diamine monomer using a solvent, and then mixing and reacting the dissolved dianhydride monomer and diamine monomer to obtain a polyamide acid resin (polyimide resin precursor). The solvent may be, for example, an aprotic solvent such as N,N-dimethylacetamide, N,N-diethylacetamide, N,N-dimethylformamide, or N-methyl-2-pyrrolidone. However, the invention is not limited thereto, and other suitable aprotic solvents may also be used.

The method of imidization may be performed using high-temperature aging, for example, continuous or segmental heating of a polyamic acid resin (polyimide resin precursor). When the polyimide resin is formed into a film or an insulating layer, the polyamide resin (polyimide resin precursor) may be coated on a substrate first, and then the entire substrate is heated in an oven for aging. A chemical closed-loop method in which an unrestricted alkaline reagent pyridine, triethylamine, or N,N-diisopropylethylamine or the like and a dehydrating reagent acetic anhydride are added to the polyamide under nitrogen or oxygen may also be used. After the reaction is completed, the colloid is filtered by water to obtain a polyimide powder, and the powder is dissolved in a solvent; in addition, a closed-loop method using a heating method may be used to add polyamide acid to an azeotropic reagent which is not limited to toluene or xylene, the temperature is raised to 180° C., and the water and azeotropic reagent produced by the polyamide acid close-loop are removed. After the reaction is completed, a polyimide solution is obtained.

<Hue Conditioning Material>

In the invention, in addition to the addition of the infrared absorbing agent to reduce the yellow index YI of the film, the polyimide film may further include a hue conditioning material, and the hue conditioning material may include a blue dye, a blue pigment, or a fluorescent dye or a fluorescent pigment having an absorption wavelength of 360 nm to 430 and an emission wavelength of 430 nm to 530 nm.

In the present embodiment, the blue dye and the blue pigment may include ultramarine; metal phthalocyanine such as Pigment 15, Pigment 15:1, Pigment 15:2, Pigment 15:3, or Pigment 15:4 produced by Lansco Colors; an anthraquinone pigment such as Pigment blue 60; and an indigo pigment such as Indigo. Based on the total weight of the polyimide film, the amount of the blue dye or the blue pigment is, for example, 0.001 wt % to 0.01 wt %.

In the present embodiment, the blue dye and the blue pigment are collided at high speed and cut by a grinding medium such as zirconia, aluminum oxide, or silicon carbide, for example, by mechanical grinding and dispersion so that the material may be suspended and dispersed in the organic solvent, and after grinding, the secondary particle size of the material thereof may be less than 200 nm. The mechanical grinding and dispersion methods may include ball mill, Attritor mill, high-performance bead milling (Media mill), etc., and the organic solvent may be ethyl acetate, n-butyl acetate, γ-butyrolactone, ethanol, isopropanol, propylene glycol, acetone, methyl ethyl ketone, and cyclopentanone, etc.

In the present embodiment, the fluorescent dye and the fluorescent pigment may include a Coumarin series such as Coumarin 1, Coumarin 2, Coumarin 4, Coumarin 7, Coumarin 30, Coumarin 47, Coumarin 102, Coumarin 151, Coumarin 152, Coumarin 152A, Coumarin 153, Coumarin 307, Coumarin 314, Coumarin 500, Coumarin 510, Coumarin 522, Coumarin 6H; Pilot 512, Fluorol 7GA, Pyridine 1, Carbazole, and the like. Based on the total weight of the polyimide film, the amount of the fluorescent dye or the fluorescent pigment is, for example, 0.001 wt % to 0.5 wt %.

<UV Absorbing Agent>

One or two or more kinds of UV absorbing agents may also be added to the polyimide film of the invention. The UV absorbing agent may be selected from general plastic materials often used as UV absorbing agents, or may be light compounds or inorganic nanomaterials having an absorption wavelength of 400 nm or less. The UV absorbing agent may be exemplified by a benzophenone compound, a salicylate compound, a benzotriazole compound, and a triazine compound, and at least one compound is selected. Via the addition of the UV absorbing agent, yellowing and deterioration of the material of the polyimide resin due to UV irradiation may be suppressed.

<Flexible Display Device Cover Substrate>

The invention also provides a flexible display device cover substrate including the polyimide film and a device protective layer. The device protective layer may be formed by a hydrophobic hard coating layer and is disposed on at least one side of the polyimide film. The total light transmittance of the flexible display device cover substrate of the invention is 85% or more and the thickness thereof is, for example, 50 μm to 200 μm. The thickness of the hydrophobic hard coating layer is, for example, 5 μm to 30 μm, and the hardness thereof is, for example, 7H to 9H.

In the present embodiment, a hydrophobic hard layer may be coated on either side of the polyimide film and cured by UV or heating. The hydrophobic hard layer may be produced by a known coating method, including slit coating, spin coating, or inkjet printing, but is not limited thereto. In the invention, the hydrophobic hard layer is composed of three or more reactive functional compounds, an initiator, an elastic oligomer, and a nano inorganic modified particle, and a blue infrared absorbing agent and a hue conditioning agent may also be added to the hydrophobic hard layer to adjust the yellow index YI of the cover substrate, and the hue conditioning material may include a blue dye, a blue pigment, or a fluorescent dye or a fluorescent pigment having an absorption wavelength of, for example, 360 nm to 430 nm and an emission wavelength of, for example, 430 nm to 530 nm. In more detail, based on the total weight of the hydrophobic hard coating layer, the amount of the blue infrared absorbing agent is, for example, 0.05 wt % to 0.5 wt %. Based on the total weight of the hydrophobic hard coating layer, the amount of the blue dye or the blue pigment is, for example, 0.001 wt % to 0.01 wt %. Based on the total weight of the hydrophobic hard coating layer, the amount of the fluorescent dye or the fluorescent pigment is, for example, 0.001 wt % to 0.5 wt %.

Examples of the three or more reactive functional group compounds include, but are not limited to, dipentaerythritolhexaacrylate, pentaerythritoltriacrylate, dipentaerythritoltriacrylate, dipentaerythritolacrylate, pentaerythritolhexaacrylate, trimethylolpropane triacrylate, trimethylallyl isocyanurate, triallyl isocyanurate, tetramethyltetravinyl cyclotetrasiloxane, trimethylolpropane ethoxy triacrylate (TMPEOTA), glycerine propoxylated triacrylate (GPTA), pentaerythritol tetraacrylate (PETA), pentaerythritol tri(meth)acrylate, pentaerythritol tetra(meth)acrylate, dipentaerythritol penta(meth)acrylate, pentaerythritol tri(meth)acrylate, dipentaerythritol penta(meth)acrylate, tripentaerythritol hepta(meth)acrylate. Three or more reactive functional group compounds may be used independently or in combination of two or more, depending on need.

The initiator may be a photoinitiator or a thermal initiator, and may be used independently or in combination of two or more. The amounts of the three or more reactive functional group compounds and the initiator are not particularly limited, and generally, the composition ratio of the three or more reactive functional groups to the initiator is 5:1 to 100:1, and based on the total weight of the hard coat material, the amounts of the three or more reactive functional compounds and the initiator are, for example, 10 wt % to 60 wt %. If the amount of the initiator is the lower limit or more, the degree of polymerization is maintained to a certain extent, and the polymer formed by the monomer retains polymer properties. If the amount of the initiator is less than or equal to the upper limit, the polymer formed by the monomer does not have the issue of being brittle due to the degree of polymerization being too high. If the amount of the monomer having an unsaturated bond is too low, the degree of crosslinking of the polymer is insufficient for curing. If the proportion of the monomer having an unsaturated bond is too high, the polymer is brittle.

Photoinitiators suitable for use in the invention include, but are not limited to, acetophenone such as 2-methyl-1-(4-(methylthio)phenyl)-2-morpholino-propane, 1-hydroxycyclohexyl phenyl ketone, diethoxyacetophenone, 2-hydroxy-2-methyl-1-phenylpropane-1-one, 2-benzyl-2-(dimethylamino)-1-[4-(morpholinyephenyl]-1-butanone, or other suitable acetophenones; benzoin such as benzoin, benzoin methyl ether, benzyl dimethyl ketal, or other suitable benzoins; benzophenone such as benzophenone, 4-phenyl benzophenone, hydroxyl benzophenone, or other suitable benzophenones; thioxanthone such as isopropyl thioxanthone, 2-chlorothioxanthone, or other suitable thioxanthones; anthraquinone such as 2-ethylanthraquinone or other suitable anthraquinones. The photoinitiators may be used independently or in combination of two or more depending on the needs of the user. For example, to obtain a faster photospeed, isopropyl thioxanthone and 2-benzyl-2-(dimethylamino)-1-[4-(morpholinyl)phenyl]-1-butanone may be mixed and used as a photoinitiator.

Thermal initiators suitable for use in the invention include, but are not limited to: azo such as 2,2'-azobis(2,4-dimethyl valeronitrile), dimethyl 2,2'-azobis (2-methylpropionate), 2,2-azobisiso butyronitrile (AIBN), 2,2-azobis(2-methylisobutyronitrile), 1,1'-azobis(cyclohexane-1-carbonitrile), 2,2'-azobis[N-(2-propenyl)-2-methylpropionamide], 1-[(cyano-1-methylethyl)azo]formamide, 2,2'-azobis(N-butyl-2-methylpropionamide), 2,2'-azobis (N-cyclohexyl-2-methylpropionamide, or other suitable azo initiators; peroxide such as benzoyl peroxide, 1,1-bis(tert-butylperoxy)cyclohexane, 2,5-bis(tert-butylperoxy)-2,5-dimethylcyclohexane, 2,5-bis(tert-butylperoxy)-2,5-dimethyl-3-cyclohexyne, bis(1-(tert-butylpeorxy)-1-methyethyl) benzene, tert-butyl hydroperoxide, tert-butyl peroxide, tert-butyl peroxybenzoate, cumene hydroperoxide, cyclohexanone peroxide, dicumyl peroxide, lauroyl peroxide, or other suitable peroxides. The thermal initiators may be used independently or in combination of two or more depending on need.

The elastic oligomer may be an oligomer of carbamate (meth)acrylic acid, and may be formed by reacting hydroxy (meth)acrylate and diisocyanate. In particular, the hydroxy (meth)acrylate may be synthesized from (meth)acrylate or propylene and polyol, and the (meth)acrylate may be methyl (meth)acrylate, ethyl (meth)acrylate, isopropyl (meth)acrylate, butyl (meth)acrylate, or cyclohexyl (meth)acrylate. The polyol may be ethylene glycol, 1,3-propylene glycol, diethylene glycol, neopentyl glycol, 1,4-butanediol, 1,6-hexanediol, 1,5-pentanediol, trimethylolpropane, glycerin, 1,3,5-triol, pentaerythritol, dipentaerythritol, and the like. The diisocyanate may be hexamethylene diisocyanate, 2,4-toluene diisocyanate, xylene diisocyanate, trimethylhexaylene diisocyanate, 4-diphenylmethane diisocyanate, 1,5-naphthalene diisocyanate, etc. Commercially available products of carbamate(meth)acrylic acid oligomer such as U-2PPA, U10-HA, U10-PA, UA-1100H, UA-15HA, UA-33H, U-200PA, UA-290TM, UA-160TM, UA-122P, etc. produced by Shin-Nakamura Chemical Co., Ltd. or UO22-081, UO26-001, UO22-162, UO52-002, UO26-012, UO22-312, etc. produced by Sun Prosper Chemicals may also be used. The added elastic oligomer has a molecular weight of 500 g/mol to 5000 g/mol, and based on the total weight of the hard coat material, the amount is, for example, 0.1 wt % to 10 wt %.

The modified nano inorganic particles may be obtained by reacting a reaction component containing unmodified nano inorganic particles and a modifier. In the reaction component, the amount of the nano inorganic particles is preferably from 90 wt % to 98 wt %, and the amount of the modifier is preferably 2 wt % to 10 wt %. Nano inorganic particles suitable for use in the invention include, but are not limited to, nano inorganic metal oxide particles such as titanium dioxide, silicon dioxide, zirconium oxide, zinc oxide, and aluminum oxide. The modifier suitable for use in the invention may be a silane coupling agent which is an organic silicon compound containing chlorosilane, alkoxysilane, or silazane. The functional group contained in the silane coupling agent may contain a vinyl group, a methacryloxy group, an acryloxy group, an amine group, a urea group, a chloropropyl group, a thiol group, a polysulfide or an isocyanate, but is not limited thereto. Examples of the silane coupling agent may contain, but are not limited to, vinyl trichlorosilane, vinyl trimethoxy silane, vinyl triethoxy silane, 3-methacryloxypropyl-methyldimethoxysilane, 3-methacryloxypropyl-trimethoxysilane, 3-methacryloxypropyl-methyldiethoxysilane, 3-methacryloxypropyl-triethoxysilane, 3-acryloxypropyl trimethoxy silane, N-2-aminoethyl-3-aminopropylmethyldimethoxysilane, N-2-aminoethyl-3-aminopropyltrimethoxysilane, N-2-aminoethyl-3-aminopropyltriethoxysilane, 3-aminopropyltrimethoxysilane, 3-aminopropyltriethoxysilane, N-phenyl-3-aminopropyltrimethoxysilane, 3-chloropropyltriethoxysilane, 3-mercaptopropyltrimethoxysilane, bis(triethoxymethanepropanepropyl)tetrasulfide, 3-isocyanatepropyltriethoxysilane.

The manner of mixing the modified nano inorganic particles and the mixture of the monomer having an unsaturated bond and the initiator is not particularly limited, and they may generally be uniformly mixed by ball milling, screw, planetary mixing, or stirring. Based on the total weight of the hard coat material, the amount of the modified nano inorganic particles is, for example, 40 wt % to 80 wt %.

In the following, the polyimide film of the examples is described in detail via experimental examples. However, the following experimental examples are not intended to limit the invention.

EXPERIMENTAL EXAMPLES

In order to prove that the polyimide film of the invention has good properties, the following experimental examples are specifically made.

Preparation of Polyimide Solution

Synthesis Example 1

8.97 g (0.028 moles) of 2,2'-bis(trifluoromethyl)benzidine (TFMB), 2.40 g (0.012 moles) of 4,4'-diaminodiphenyl ether (ODA), and 100 g of dimethylacetamide (DMAc) were placed in a three-necked flask. After stirring at 30° C. until completely dissolved, 8.8 g (0.02 moles) of 2,2'-bis-(3,4-dicarboxyphenyl)hexafluoropropane dianhydride (6FDA) and 5.88 g (0.02 moles) of biphenyltetracarboxylic dianhydride (BPDA) were added, and then continuous stirring was performed and the mixture was reacted at 25° C. for 24 hours to obtain a polyamic acid solution. Thereafter, 7.46 g (0.06 moles) of pyridine and 12.252 g (0.12 moles) of acetic anhydride were further added, followed by continuous stirring and reacting at room temperature for 24 hours. After the completion of the reaction, polyimide precipitation was performed in a methanol/water (volume ratio 1:2) solution, and the powder was collected by filtration and dried to obtain a polyimide powder. Lastly, the powder was dissolved in a dimethylacetamide solvent to form a 20 wt % polyimide solution.

Preparation of Polyimide Film

Example 1

100 g of the polyimide solution of Synthesis example 1 was added with 0.86 g of cesium tungsten oxide $CsWO_3$ (particle size 50 nm dispersed in dimethylacetamide at a concentration of 5 wt %), and after 30 minutes of stirring and mixing, the mixture was coated on a glass substrate by doctor blade and surface-dried in an oven to achieve a surface dry temperature of 100° C. Then, under a nitrogen atmosphere, heating and baking was performed at an infrared wavelength of 800 nm to 3000 nm for 10 minutes to obtain a polyimide film.

Example 2

100 g of the polyimide solution of Synthesis example 1 was added with 0.9 g of Prussian blue (particle size 20 nm dispersed in dimethylacetamide at a concentration of 5 wt %), and after 30 minutes of stirring and mixing, the mixture was coated on a glass substrate by doctor blade and surface-dried in an oven to achieve a surface dry temperature of 100° C. Then, under a nitrogen atmosphere, heating and baking was performed at an infrared wavelength of 800 nm to 3000 nm for 10 minutes to obtain a polyimide film.

Example 3

100 g of the polyimide solution of Synthesis example 1 was added with 0.9 g of tungsten oxide $WO_3$ (particle size 20 nm dispersed in dimethylacetamide at a concentration of 5 wt %), and after 30 minutes of stirring and mixing, the mixture was coated on a glass substrate by doctor blade and surface-dried in an oven to achieve a surface dry temperature of 100° C. Then, under a nitrogen atmosphere, heating and baking was performed at an infrared wavelength of 800 nm to 3000 nm for 10 minutes to obtain a polyimide film.

Example 4

100 g of the polyimide solution of Synthesis example 1 was added with 1.68 g of cesium tungsten oxide $CsWO_3$ (particle size 50 nm dispersed in dimethylacetamide at a concentration of 5 wt %), and after 30 minutes of stirring and mixing, the mixture was coated on a glass substrate by doctor blade and surface-dried in an oven to achieve a surface dry temperature of 100° C. Then, under a nitrogen atmosphere, heating and baking was performed at an infrared wavelength of 800 nm to 3000 nm for 10 minutes to obtain a polyimide film.

Example 5

100 g of the polyimide solution of Synthesis example 1 was added with 0.2 g of cesium tungsten oxide $CsWO_3$ (particle size 50 nm dispersed in dimethylacetamide at a concentration of 5 wt %), and after 30 minutes of stirring and mixing, the mixture was coated on a glass substrate by doctor blade and surface-dried in an oven to achieve a surface dry temperature of 100° C. Then, under a nitrogen atmosphere, heating and baking was performed at an infrared wavelength of 800 nm to 3000 nm for 10 minutes to obtain a polyimide film.

Example 6

100 g of the polyimide solution of Synthesis example 1 was added with 0.9 g of Prussian blue (particle size 20 nm dispersed in dimethylacetamide at a concentration of 5 wt %) and 0.2 g Pigment blue 15 (particle size 100 nm dispersed in dimethylacetamide at a concentration of 0.1 wt %), and after 30 minutes of stirring and mixing, the mixture was coated on a glass substrate by doctor blade and surface-dried in an oven to achieve a surface dry temperature of 100° C. Then, under a nitrogen atmosphere, heating and baking was performed at an infrared wavelength of 800 nm to 3000 nm for 10 minutes to obtain a polyimide film.

Example 7

100 g of the polyimide solution of Synthesis example 1 was added with 0.9 g of Prussian blue (particle size 20 nm dispersed in dimethylacetamide at a concentration of 5 wt %) and 0.2 g Coumarin 7 (dissolved in methylacetamide at a concentration of 0.1 wt %), and after 30 minutes of stirring and mixing, the mixture was coated on a glass substrate by doctor blade and surface-dried in an oven to achieve a surface dry temperature of 100° C. Then, under a nitrogen atmosphere, heating and baking was performed at an infrared wavelength of 800 nm to 3000 nm for 10 minutes to obtain a polyimide film.

Comparative Example 1

The polyimide solution of Synthesis example 1 was coated on a glass substrate by doctor blade and surface-dried in an oven at a surface dry temperature of 100° C. Then, under a nitrogen atmosphere, heating and baking was performed at an infrared wavelength of 800 nm to 3000 nm for 10 minutes to obtain a polyimide film.

Comparative Example 2

100 g of the polyimide solution of Synthesis example 1 was added with 2 g of cesium tungsten oxide $CsWO_3$ (particle size 300 nm dispersed in dimethylacetamide at a concentration of 5 wt %), and after 30 minutes of stirring and mixing, the mixture was coated on a glass substrate by doctor blade and surface-dried in an oven to achieve a surface dry temperature of 100° C. Then, under a nitrogen atmosphere, heating and baking was performed at an infrared wavelength of 800 nm to 3000 nm for 10 minutes to obtain a polyimide film.

Comparative Example 3

100 g of the polyimide solution of Synthesis example 1 was added with 1 g of Pigment Blue 15 (particle size 100 nm dispersed in dimethylacetamide at a concentration of 0.1 wt %), and after 30 minutes of stirring and mixing, the mixture was coated on a glass substrate by doctor blade and surface-dried in an oven to achieve a surface dry temperature of 100° C. Then, under a nitrogen atmosphere, heating and baking was performed at an infrared wavelength of 800 nm to 3000 nm for 10 minutes to obtain a polyimide film.

Comparative Example 4

100 g of the polyimide solution of Synthesis example 1 was added with 2 g of cesium tungsten oxide $CsWO_3$ (particle size 50 nm dispersed in dimethylacetamide at a concentration of 5 wt %), and after 30 minutes of stirring and mixing, the mixture was coated on a glass substrate by doctor blade and surface-dried in an oven to achieve a surface dry temperature of 100° C. Then, under a nitrogen atmosphere, heating and baking was performed at an infrared wavelength of 800 nm to 3000 nm for 10 minutes to obtain a polyimide film.

Comparative Example 5

100 g of the polyimide solution of Synthesis example 1 was added with 0.11 g of cesium tungsten oxide $CsWO_3$ (particle size 50 nm dispersed in dimethylacetamide at a concentration of 5 wt %), and after 30 minutes of stirring and mixing, the mixture was coated on a glass substrate by doctor blade and surface-dried in an oven to achieve a surface dry temperature of 100° C. Then, under a nitrogen atmosphere, heating and baking was performed at an infrared wavelength of 800 nm to 3000 nm for 10 minutes to obtain a polyimide film.

Comparative Example 6

The polyimide solution of Synthesis example 1 was coated on a glass substrate by doctor blade and surface-dried in an oven at a surface dry temperature of 100° C. Then, heating was performed to 280° C. by a hot air baking method under a nitrogen atmosphere for a baking time of 60 minutes.

Performance Evaluation

Thickness Measurement

The thickness of each plastic substrate was measured via thickness gauge contact, and the thickness of the hard coating on the plastic substrate was measured by Alpha Step.

Total Light Transmittance (%) Measurement

The total light transmittance and haze of the cover substrate were measured using Nippon Denshoku DOH 5500 according to ASTM D1007.

Yellow Index Measurement

The yellow index YI value of the cover substrate was measured using Nippon Denshoku DOH 5500 according to ASTM E313. The yellow index YI is a tristimulus value (x, y, z) measured by a spectrophotometer for transmittance measurement of light of 400 nm to 700 nm, and YI is calculated by the following formula.

$$YI = 100 \times (1.2769x - 1.0592z)/y$$

IR Irradiation Surface Temperature Measurement

The surface of the polyimide film was irradiated with infrared light having a wavelength of 800 nm to 3000 nm, and the surface temperature variation was measured.

Chemical Resistance Evaluation

A polyimide film was immersed in methyl ethyl ketone at room temperature. After 1 minute, it was confirmed whether there was white haze on the film surface, with ○ indicating no white haze and × indicating white haze.

The test results of the performance evaluation are recorded in Table 1.

TABLE 1

| No. | PI colloid weight | IR absorbing agent | Particle size | Amount | Hue conditioning agent | Particle size | Amount | Thickness | Transmittance | Haze | YI | Surface temperature after 10 minutes of IR irradiation | Solvent resistance |
|---|---|---|---|---|---|---|---|---|---|---|---|---|---|
| Unit | G | — | nm | % | — | nm | % | um | % | % | — | ° C. | ° C. |
| Example 1 | 100 | CsWO3 | 50 | 0.23 | — | — | — | 50 | 88 | 0.3 | 1.5 | 300 | ○ |
| Example 2 | 100 | Prussian blue | 20 | 0.25 | — | — | — | 50 | 89 | 0.4 | 1.4 | 310 | ○ |
| Example 3 | 100 | WO3 | 40 | 0.25 | — | — | — | 50 | 88 | 0.3 | 1.7 | 300 | ○ |
| Example 4 | 100 | CsWO3 | 50 | 0.46 | — | — | — | 50 | 86 | 0.4 | 0.7 | 350 | ○ |
| Example 5 | 100 | CsWO3 | 50 | 0.055 | — | — | — | 50 | 90 | 0.3 | 1.9 | 280 | ○ |
| Example 6 | 100 | Prussian blue | 20 | 0.25 | PB15 | 100 | 0.001 | 50 | 88 | 0.3 | 0.9 | 310 | ○ |
| Example 7 | 100 | Prussian blue | 20 | 0.25 | Coumarin7 | — | 0.001 | 50 | 89 | 0.4 | 1.0 | 310 | ○ |
| Comparative example 1 | 100 | — | — | — | — | — | — | 50 | 90 | 0.2 | 3.3 | 200 | X |
| Comparative example 2 | 100 | CsWO3 | 300 | 0.55 | — | — | — | 50 | 87 | 2.3 | 3.0 | 230 | X |
| Comparative example 3 | 100 | — | — | — | PB15 | 100 | 0.005 | 50 | 88 | 0.4 | 1.45 | 200 | X |
| Comparative example 4 | 100 | CsWO3 | 50 | 0.55 | — | — | — | 50 | 84 | 0.3 | 0.5 | 360 | ○ |
| Comparative example 5 | 100 | CsWO3 | 50 | 0.03 | — | — | — | 50 | 89 | 0.5 | 2.5 | 230 | X |
| Comparative example 6 | 100 | — | — | — | — | — | — | 50 | 90 | 0.2 | 3.3 | — | ○ |

The results from Example 1 to Example 5 and Comparative example 1 show that when a blue infrared absorbing agent is added to the polyimide film, the yellow color of the polyimide film may be toned via the blue color produced by the blue infrared absorbing agent absorbing between 500 and 700, so that the addition of different blue infrared absorbing agents may all reduce the yellow index of the polyimide film to 2 or less. Moreover, after the blue infrared absorbing agent is added, the light absorbing ability in infrared may be improved as shown in FIG. 1, and therefore the heating efficiency of infrared irradiation is enhanced, so that the surface temperature may reach 280° C. or higher under infrared irradiation, and the temperature tends to increase with an increase in the amount.

The results of Example 1 and Comparative example 2 show that when the particle size of the blue infrared absorbing agent added is too large, the ability to absorb infrared is lowered, and therefore photothermal conversion efficiency is lowered, resulting in no significant increase in temperature under the same infrared irradiation. Therefore, the degree of solvent resistance of the polyimide film is insufficient.

The results of Examples 4 and 5 and Comparative examples 4 and 5 show that, when the concentration of the infrared absorbing agent is less than 0.05%, the yellow index of the polyimide film thereof is greater than 2, and the surface temperature of the film after infrared irradiation cannot be effectively increased, which is not significantly different from the temperature of Comparative example 1 without the infrared absorbing agent. When the amount of the infrared absorbing agent is greater than 0.5%, although the yellow index of the polyimide may be reduced to 1 or less, the light transmittance of the polyimide film is less than 85% due to the absorption of visible light of the infrared absorbing agent.

The results of Comparative example 1 and Comparative example 6 show that, when the polyimide film without the addition of the infrared absorbing agent was heated to 280° C. for 60 minutes in a hot air circulating oven, the polyimide film at this time was also able to withstand the erosion of methyl ethyl ketone. From the viewpoint of imidization, when the polyimide is close looped by thermal imidization, the lowest closed-loop temperature is 250° C., and if the temperature is too low, the closed loop is incomplete and chemical resistance is deteriorated. In the case of a chemical closed-loop method, although complete imidization is achieved, an isoimide structure is formed due to catalysis by a chemical catalyst, and therefore the chemical resistance of polyimide is degraded, and a heat-setting step is generally needed to convert isoimide into an imide structure to improve chemical resistance. Therefore, under infrared heating, if the surface temperature cannot exceed 250° C., the chemical resistance of the polyimide is affected.

In addition, a hue conditioning agent may also be added to adjust the yellow index YI of the polyimide film, and Example 6 and Example 7 show that the addition of PB15 and Coumarin fluorescent materials may both effectively reduce the yellow index of the polyimide film. However, if only the hue conditioning agent is added, the material only has yellow to orange absorption, which does not contribute to infrared absorption, so that no photothermal effect occurs under infrared irradiation, as shown in FIG. 1, so the surface temperature of the film is the same as the results of Comparative example 1 without the hue conditioning agent.

Preparation Example 1

A hard coating composition was prepared, and a coating having high hardness could be formed by either heat curing or photocuring. The modified nano inorganic particles in the hard coating were obtained by mixing 1 part by weight of a nano silicon dioxide particle solution and 0.01 parts by weight of 3-methacryloxypropyl-trimethoxy silane, and the mixture was reacted by heating at 50° C. for 4 hours under nitrogen to perform modification synthesis. After the reaction was completed, the mixture was cooled to room temperature, and 1 part by weight of the modified nanoparticle solution was added to 0.133 parts by weight of pentaerythritol hexaacrylate and 0.133 parts by weight of the elastic oligomer UA160-TM and stirred for 30 minutes, and then solution phase inversion was performed according to the solvent required. Lastly, a solution formed by mixing 1.5 parts by weight of the modified nano inorganic particles and a monomer having an unsaturated bond, 0.03 parts by weight of 2-methyl-1-(4-(methylthiol)phenyl-2-morpholino-propane, and 0.01 parts by weight of a leveling agent were mixed, and the final solid content was adjusted to 55% with an ethyl acetate solvent. A composition of the subsequent examples and comparative examples was obtained by adding a suitable concentration of the hue conditioning material.

Example 8

20 g of the hard coating composition was spin-coated at 250 rpm for 10 seconds on the surface of the polyimide film produced in Example 1, soft baked at 80° C. for 5 minutes, exposed at 500 mJ/cm$^2$, and lastly hard baked at 180° C. for 30 minutes.

Example 9

20 g of the hard coating composition was taken, and 1 g of PB15 (0.25% mixed with n-butyl acetate, particle size of 100 nm) was added thereto, and after 30 minutes of stirring and mixing, the mixture was spin-coated at 250 rpm for 10 seconds on the surface of the polyimide film produced in Example 1, then soft baked at 80° C. for 5 minutes and then exposed at 500 mJ/cm$^2$, and lastly hard baked at 180° C. for 30 minutes.

Example 10

20 g of the hard coating composition was taken, and 0.11 g of Coumarin 1 (1% dissolved in ethyl acetate) was added thereto, and after 30 minutes of stirring and mixing, the mixture was spin-coated at 250 rpm for 10 seconds on the surface of the polyimide film produced in Example 1, then soft baked at 80° C. for 5 minutes and then exposed at 500 mJ/cm$^2$, and lastly hard baked at 180° C. for 30 minutes.

Comparative Example 7

20 g of the hard coating composition was taken, and 1 g of PB15 (0.25% mixed with n-butyl acetate, particle size of 400 nm) was added thereto, and after 30 minutes of stirring and mixing, the mixture was spin-coated at 250 rpm for 10 seconds on the surface of the polyimide film produced in Example 1, then soft baked at 80° C. for 5 minutes and then exposed at 500 mJ/cm$^2$, and lastly hard baked at 180° C. for 30 minutes.

Pencil Hardness Measurement

Using an electronic pencil hardness tester, a 10 mm long line was drawn five times on each of the cover substrates with a Mitsubishi test pencil at a speed of 30 mm/min under a load of 750 g, and the surface scratch was compared with the pencil hardness.

Bending Performance

The cover substrate was attached to a folding tester (YUASA System U-shape Folding) and folded 100,000 times at R=1 mm, then the cover substrate was first observed for fracture, and then the hard coating was observed with a naked eye and a microscope for cracks. Any case where the cover substrate was fractured or the hard coating was cracked was marked as unacceptable (X), and cases where there was no fractures or cracks were marked as acceptable (O).

The performance test results are shown in Table 2 below.

TABLE 2

| No. | Hue conditioning material | Weight ratio in hard coating | Particle size | Hard coating thickness | PI substrate thickness | Transmittance | Haze | YI | Pencil hardness | Bending performance |
|---|---|---|---|---|---|---|---|---|---|---|
| Unit | — | % | nm | um | um | % | % | — | — | — |
| Example 8 | — | — | — | 20 | 50 | 90.8 | 0.5 | 1.5 | 9H | O |
| Example 9 | PB15 | 0.27 | 100 | 20 | 50 | 90.1 | 0.4 | 1.0 | 9H | O |
| Example 10 | Prussian blue | 0.5 | 20 | 20 | 50 | 90.7 | 0.4 | 1.2 | 9H | O |
| Comparetive example 7 | PB15 | 0.27 | 400 | 20 | 50 | 89.7 | 0.7 | 1.0 | 8H | X |

Example 9 and Example 10 show that an infrared absorbing material and a hue conditioning material may be added to the hard coating to reduce the yellow index YI of the cover substrate, and the results of Example 9 and Comparative example 1 show that when the particle size of the hue conditioning material is greater than >200 nm, the particle size is too large, and therefore a defect occurs in the hard coating due to an agglomeration phenomenon, so that the overall strength and surface smoothness of the hard coating are affected, resulting in a fracture phenomenon when the cover substrate is folded.

Based on the above, the polyimide film of the invention contains an infrared absorbing agent having infrared absorbing and photothermal conversion effects. Therefore, the surface temperature of the polyimide resin may be increased by infrared irradiation to shorten baking time, reduce energy loss, and increase production rate. Moreover, the infrared absorbing agent may also be used as a hue conditioning agent and a UV absorbing agent to reduce the yellow index of the transparent polyimide and reduce the yellowing caused by long-term UV irradiation, thereby alleviating the visual yellowing phenomenon of the appearance.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A polyimide film, comprising:
   a polyimide; and
   a blue infrared absorbing agent comprising cesium tungsten oxide, tungsten oxide, Prussian blue, or antimony tin oxide,
   wherein based on a total weight of the polyimide film, an amount of the blue infrared absorbing agent is 0.05 wt % to 0.5 wt %.

2. The polyimide film of claim 1, wherein the polyimide film has an absorption peak at a wavelength of 800 nm to 4000 nm.

3. The polyimide film of claim 1, wherein a thickness of the polyimide film is 10 μm to 100 μm, a total light transmittance thereof is 85% or more, and a yellow index YI thereof is less than 2.

4. The polyimide film of claim 1, wherein an absorption wavelength of the blue infrared absorbing agent is 500 nm to 4000 nm, and a thermal conversion efficiency of the blue infrared absorbing agent is greater than 50%.

5. The polyimide film of claim 1, wherein a particle size of the blue infrared absorbing agent is less than 100 nm.

6. The polyimide film of claim 1, further comprising a hue conditioning material, wherein the hue conditioning material comprises a blue dye, a blue pigment, a fluorescent dye or a fluorescent pigment, the fluorescent dye or the fluorescent pigment has an absorption wavelength of 360 nm to 430 nm and an emission wavelength of 430 from nm to 530 nm.

7. The polyimide film of claim 6, wherein based on a total weight of the polyimide film an amount of the blue dye or the blue pigment is 0.001 wt % to 0.01 wt %.

8. The polyimide film of claim 6, wherein based on a total weight of the polyimide film, an amount of the fluorescent dye or the fluorescent pigment is 0.001 wt % to 0.5 wt %.

9. The polyimide film of claim 1, wherein the blue infrared absorbing agent has a hue conditioning effect.

10. A flexible display device cover substrate, comprising:
    the polyimide film of claim 1; and
    a device protective layer formed by a hydrophobic hard coating layer and disposed on at least one side of the polyimide film.

11. The flexible display device cover substrate of claim 10, wherein a total light transmittance of the flexible display device cover substrate is 85% or more and a thickness thereof is 50 μm to 200 μm.

12. The flexible display device cover substrate of claim 10, wherein a thickness of the hydrophobic hard coating layer is 5 μm to 30 μm and a hardness thereof is 7H to 9H.

13. The flexible display device cover substrate of claim 10, wherein the hydrophobic hard coating layer contains a blue infrared absorbing agent and a hue conditioning material, and the hue conditioning material comprises a blue dye, a blue pigment, or a fluorescent dye or a fluorescent pigment having an absorption wavelength of 360 nm to 430 nm and an emission wavelength of 430 nm to 530 nm.

* * * * *